United States Patent
Wang et al.

(10) Patent No.: US 8,341,509 B2
(45) Date of Patent: Dec. 25, 2012

(54) FORWARD ERROR CORRECTION (FEC) SCHEME FOR COMMUNICATIONS

(75) Inventors: Zhongfeng Wang, Irvine, CA (US); Chung-Jue Chen, Irvine, CA (US); Kang Xiao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 358 days.

(21) Appl. No.: 12/725,887

(22) Filed: Mar. 17, 2010

(65) Prior Publication Data
US 2010/0241925 A1    Sep. 23, 2010

Related U.S. Application Data

(60) Provisional application No. 61/161,030, filed on Mar. 17, 2009.

(51) Int. Cl.
*G06F 11/00* (2006.01)
(52) U.S. Cl. ........................... 714/801; 714/781
(58) Field of Classification Search .............. 714/755, 714/758, 782, 784, 801, 781; 375/271; 358/426.1
See application file for complete search history.

(56) References Cited

U.S. PATENT DOCUMENTS

| | | | | |
|---|---|---|---|---|
| 6,829,308 B2* | 12/2004 | Eroz et al. | ...................... | 375/271 |
| 6,895,547 B2* | 5/2005 | Eleftheriou et al. | .......... | 714/801 |
| 2007/0124652 A1* | 5/2007 | Litsyn et al. | ................... | 714/776 |
| 2008/0115036 A1* | 5/2008 | Kuznetsov et al. | ........... | 714/758 |
| 2008/0301518 A1* | 12/2008 | Miyazaki | ...................... | 714/752 |

OTHER PUBLICATIONS

Ajit Nimbalker, Turbo-like Decoding Algorithm for Structured LDPC codes, Jul. 9, 2006, ip.com.*
Mark Johnson, Multibit Error Correction in a Monolithic Semiconductor Memory, Sep. 26, 2003, ip.com.*

* cited by examiner

*Primary Examiner* — M. Mujtaba K Chaudry
(74) *Attorney, Agent, or Firm* — Garlick & Markison; Shayne X. Short

(57) ABSTRACT

Forward error correction (FEC) scheme for communications. Appropriate selection/arrangement of bits of an information bit sequence undergo one or more types of subsequent encoding to generate a coded bit sequence that may subsequently undergo appropriate processing to generate a continuous time signal to be launched within a communication channel. In some embodiments, an information bit sequence, after being partitioning into a number of information bit groups, initially undergoes a first encoding within a first encoding module thereby generating a number of redundancy/parity bit groups (e.g., e.g., each redundancy/parity bit group corresponding to one of the information bit groups). Then, after performing any desired and appropriate selection/arrangement of bits within the redundancy/parity bit groups and the information bit groups, second encoding within a second encoding module is performed thereon to generate additional redundancy/parity bits. In addition, interleaving may be performing at various stages of the encoding processing.

20 Claims, 15 Drawing Sheets

Fig. 4 (row encoding)

Fig. 5 (column encoding)

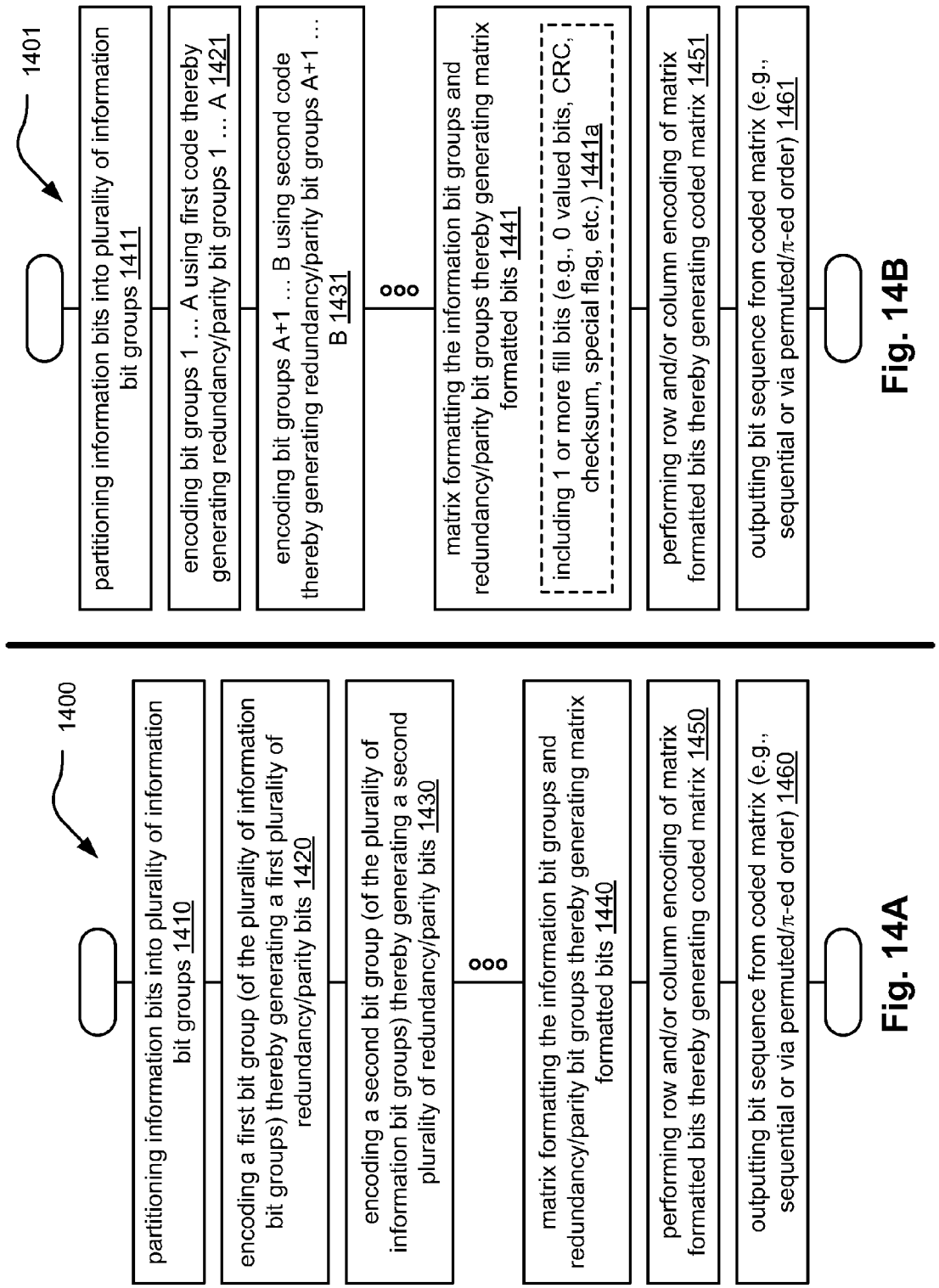

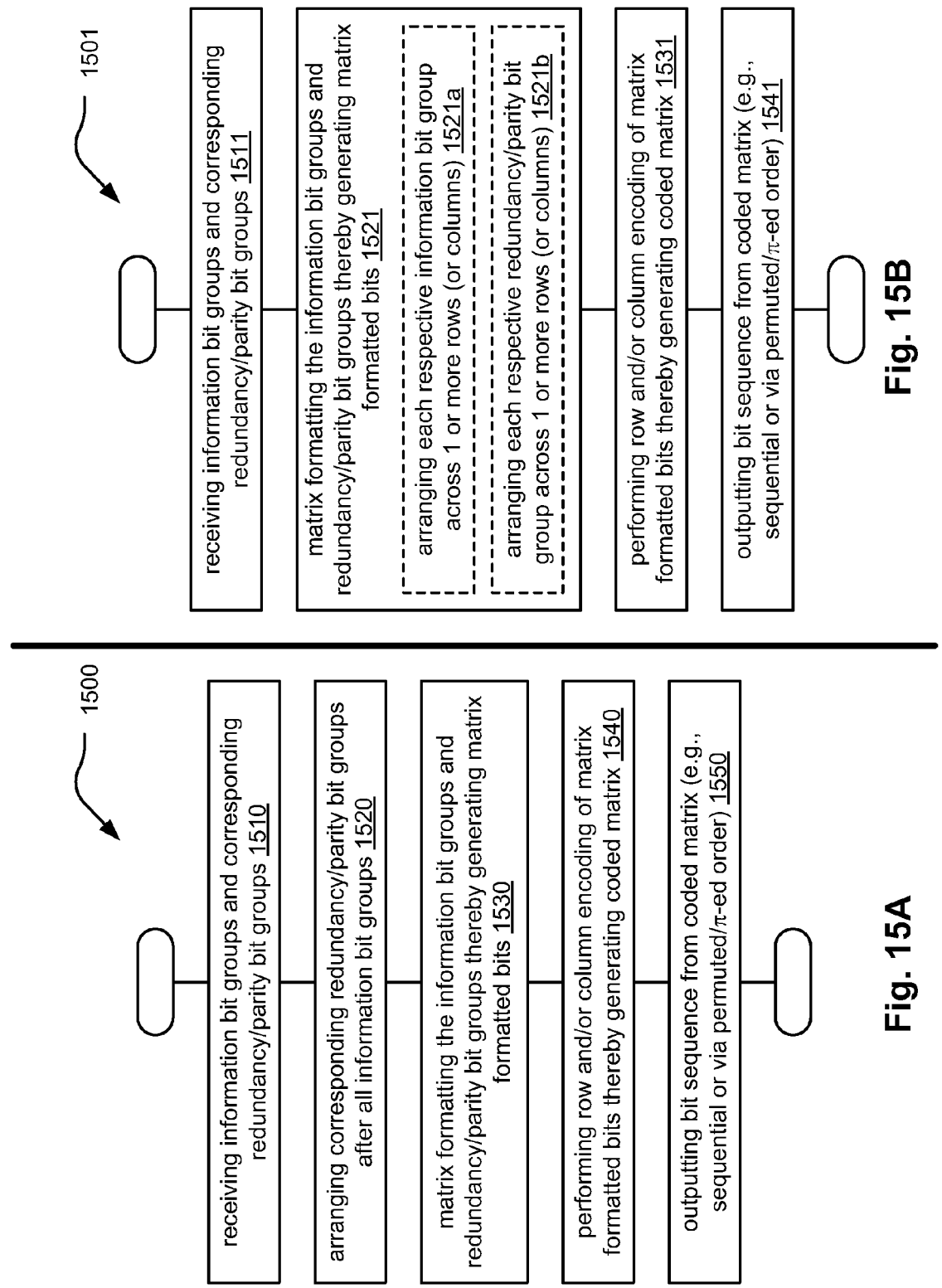

ly relates to design optimization and trade-off of various operational parameters such as hardware complexity, power consumption, decoding latency, and gain within communication devices.

FORWARD ERROR CORRECTION (FEC) SCHEME FOR COMMUNICATIONS

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 61/161,030, entitled "Forward error correction (FEC) scheme for communications," filed Mar. 17, 2009, pending.

BACKGROUND OF THE INVENTION

1. Technical Field of the Invention

The invention relates generally to design optimization and trade-off within communication devices; and, more particularly, it relates to design optimization and trade-off of various operational parameters such as hardware complexity, power consumption, decoding latency, and gain within communication devices.

2. Description of Related Art

Data communication systems have been under continual development for many years. One such type of communication system that has been of significant interest lately is a communication system that employs iterative error correction codes (ECCs) that operate in accordance with forward error correction (FEC). There are a variety of types of ECCs including Reed-Solomon (RS) code, turbo codes, turbo trellis code modulation (TTCM) code, LDPC (Low Density Parity Check) code, etc. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Generally speaking, within the context of communication systems that employ ECCs, there is a first communication device at one end of a communication channel with encoder capability and second communication device at the other end of the communication channel with decoder capability. In many instances, one or both of these two communication devices includes encoder and decoder capability (e.g., within a bi-directional communication system). ECCs can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 14A, FIG. 14B, FIG. 15A, and FIG. 15B illustrate various embodiments of a method for performing matrix formatting and product code encoding.

DETAILED DESCRIPTION OF THE INVENTION

Figure 1:
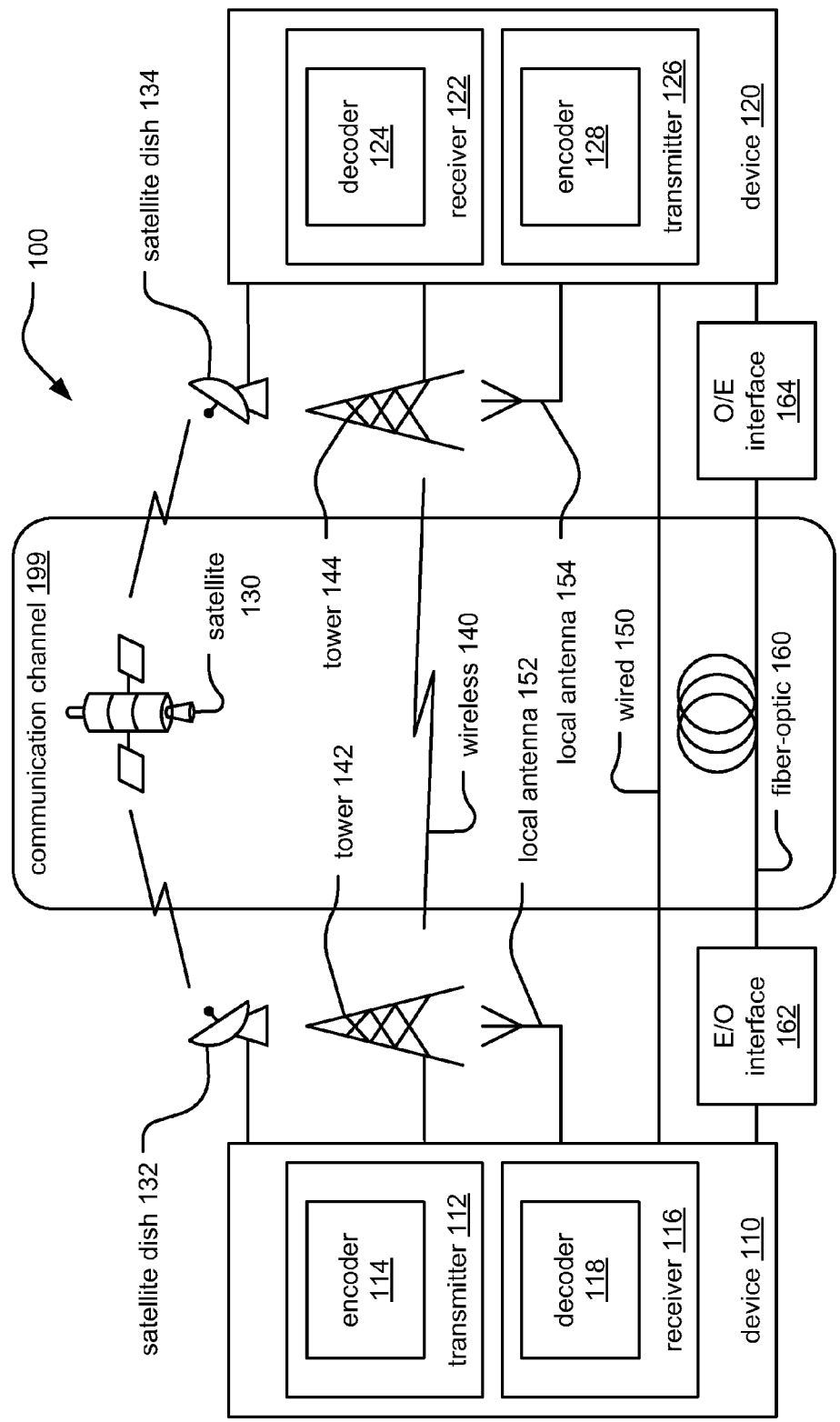
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
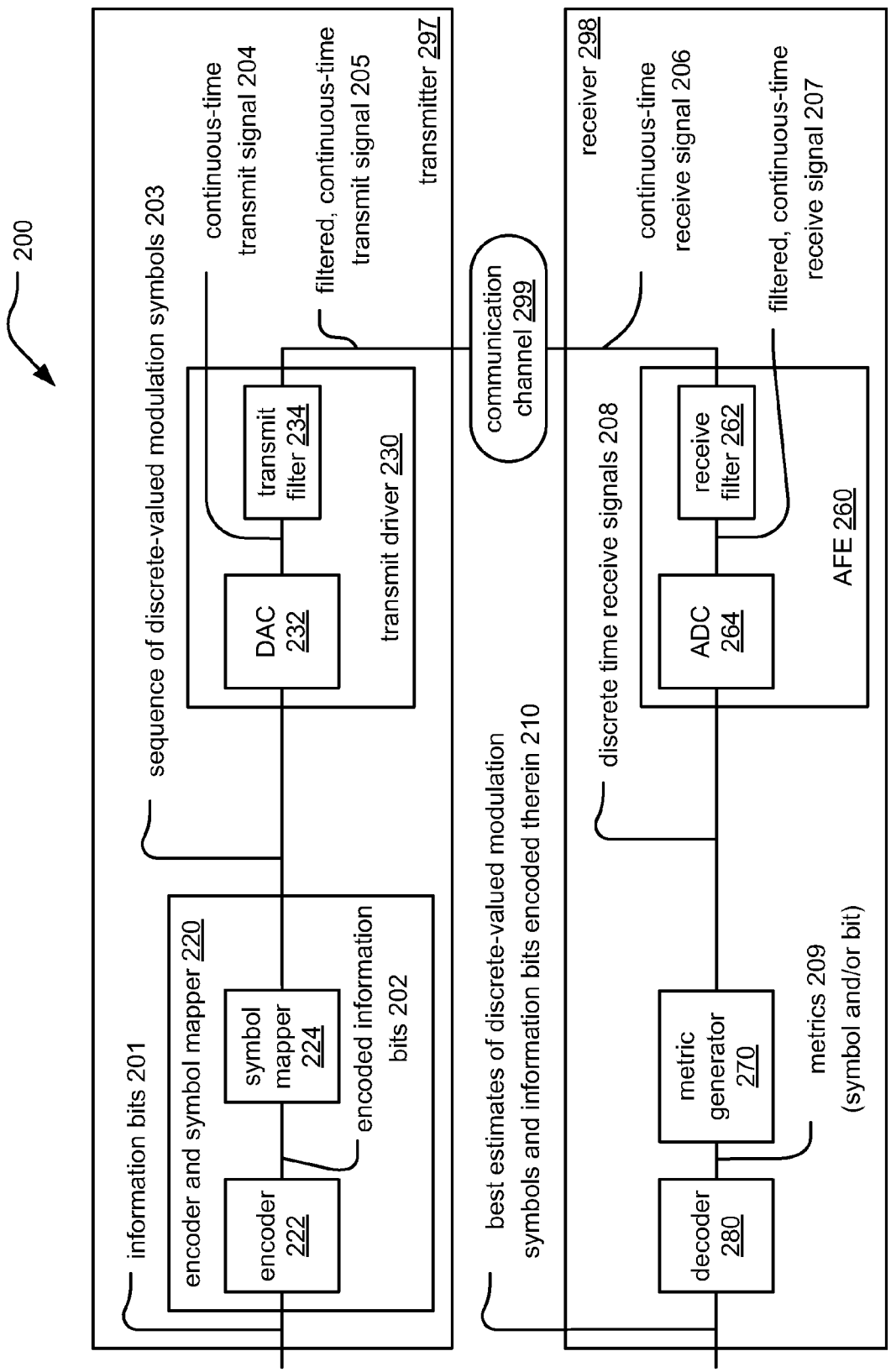

FIG. 1 and FIG. 2 illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of coding described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. The transmit driver 230 may perform any necessary front end processing of a signal received from a communication channel (e.g., including any one or digital to analog conversion, gain adjustment, filtering, frequency conversion, etc.) to generate the filtered, continuous-time transmit signal 205.

At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). The AFE 260 may perform any necessary front end processing of a signal received from a communication channel (e.g., including any one or analog to digital conversion, gain adjustment, filtering, frequency conversion, etc.) to generate a digital signal provided to a metric generator 270 that generates a plurality of metrics corresponding to a particular bit or symbol extracted from the received signal. The metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention.

It is noted that various types of error correction codes (ECCs) may be employed herein. For example, any one or more of any type or variant of Reed-Solomon (RS) code, turbo code, turbo trellis code modulation (TTCM) code, LDPC (Low Density Parity Check) code, BCH (Bose and Ray-Chaudhuri, and Hocquenghem) code, etc. Moreover, as will be seen in various embodiments herein, more than one ECC and/or more than one type of ECC may be employed when generating a single encoded signal in accordance with the principles presented herein. For example, certain of the embodiments presented herein operate as product codes, in which an ECC is employed more than once or more than one type of ECC is employed (e.g., a first ECC during a first time and a second ECC at a second time) to generate an encoded signal.

Moreover, it is noted that both systematic encoding and non-systematic encoding may be performed in accordance with the various principles presented herein. Systematic encoding preserves the information bits being encoded and generates corresponding redundancy/parity bits (i.e., redundancy and parity may be used interchangeably herein); for example, the information bits being encoded are explicitly shown/represented in the output of non-systematic encoding. Non-systematic encoding does not necessarily preserve the information bits being encoded and generates coded bits that inherently include redundancy parity information therein; for example, the information bits being encoded need not be explicitly shown/represented in the output of non-systematic encoding. While many of the embodiments shown herein refer to systematic encoding, it is note that non-systematic encoding may alternatively, be performed in any embodiment without departing from the scope and spirit of the invention.

Certain embodiments of communication device and methods operating in accordance with the principles presented herein are designed to maximize coding gain as high as possible while maintaining a reasonable or acceptable hardware complexity and power consumption. Moreover, certain embodiments (e.g., to be compliant in accordance with a certain standard or communication protocol), certain constraints such as bit error rate (BER) or block error rate (BLER), redundancy rate or code rate, bit rates, throughput, etc.

For example, one embodiment that operates in accordance with a 100 Gbps (Giga-bit per second) bit rate targets a BER in the range of $1 \times 10^{-14}$ or $1 \times 10^{-15}$, and has a fixed redundancy rate of $16/239$ or 6.69%.

In general, hard decoding is generally preferred for its relatively low complexity (e.g., when compared to soft decoding). Soft decoding codes such as LDPC codes can have net code gain (NCG) over 9.5 dB at BER of $1 \times 10^{-15}$ with reasonable hardware complexity and much less memory requirement compared to some of the G975.1 compliant codes. However, for a single LDPC code with reasonably long code length (e.g., 16K bit bock length), having error floor below BER of $1 \times 10^{-14}$ may not be satisfied (i.e., not avoidable).

Herein, a means is presented by which an optimal trade-off between hardware complexity, power consumption, and decoding latency and gain may be achieved.

Figure 3:
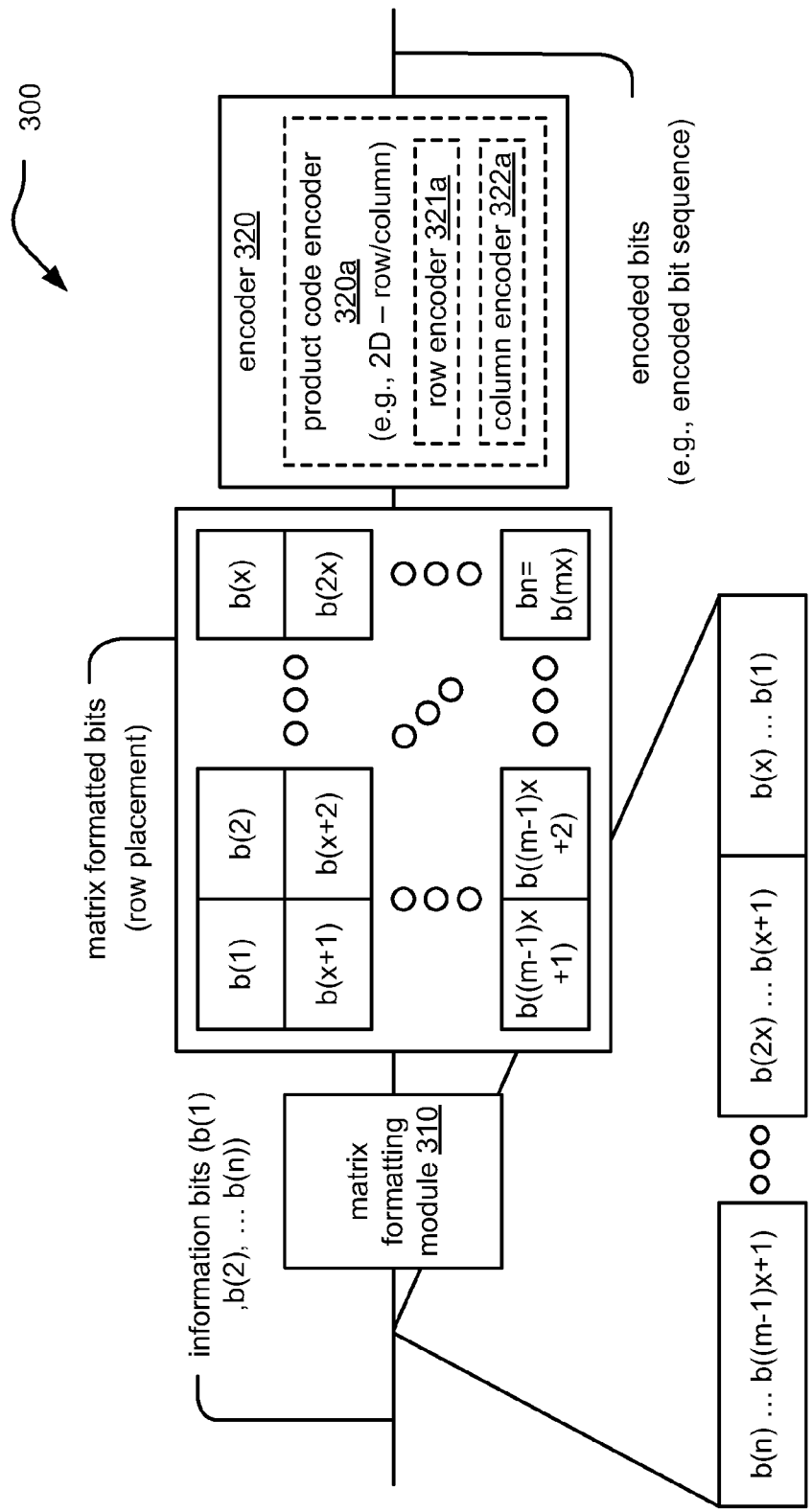
FIG. 3 illustrates an embodiment of an apparatus that is operative to perform matrix formatting and product code encoding.

FIG. 3 illustrates an embodiment of an apparatus 300 that is operative to perform matrix formatting and product code encoding. In this embodiment, an information bit sequence (e.g., including bits 1 through n as depicted by b(1), b(2), and so on up to b(n)) is provided to a matrix formatting module 310. The matrix formatting module 310 operates by selecting/arranging the information bit sequence into a desired format/pattern. For example, the information bit sequence may be firstly arranged into information bit groups (e.g., first information bit group including bits b(1) through b(x), second information bit group including bits b(x+1) through b(2x), and so on until an m-th information bit group including bits b((m−1)x+1) through b(n)[end of original information bit sequence]), and each information bit group then is arranged appropriately into rows (e.g., row placement) thereby generating matrix formatted bits.

An encoder 320 selectively encodes the matrix formatted bits thereby generating encoded bits (e.g., an encoded bit sequence). For example, parity bits corresponding to the matrix formatted bits are generated in accordance with encoding.

In some embodiments, the encoder 320 is a product code encoder 320a. A product code encoder may be viewed as being a two dimensional encoder that operates in a first dimension, and then operates in a second dimension. Each of these two dimensions may employ a common ECC, or they may employ different ECCs. In one embodiment, the first dimension is performed using a row encoder 321a, and the second dimension is performed using a column encoder 322a.

It is noted that a common ECC may be employed when encoding the separate rows of bits within the matrix formatted bits; alternatively, different ECCs may be employed when encoding the various rows of bits within the matrix formatted bits. Similarly, a common ECC may be employed when encoding the separate columns of bits within the matrix formatted bits; alternatively, different ECCs may be employed when encoding the various columns of bits within the matrix formatted bits.

Figure 4:
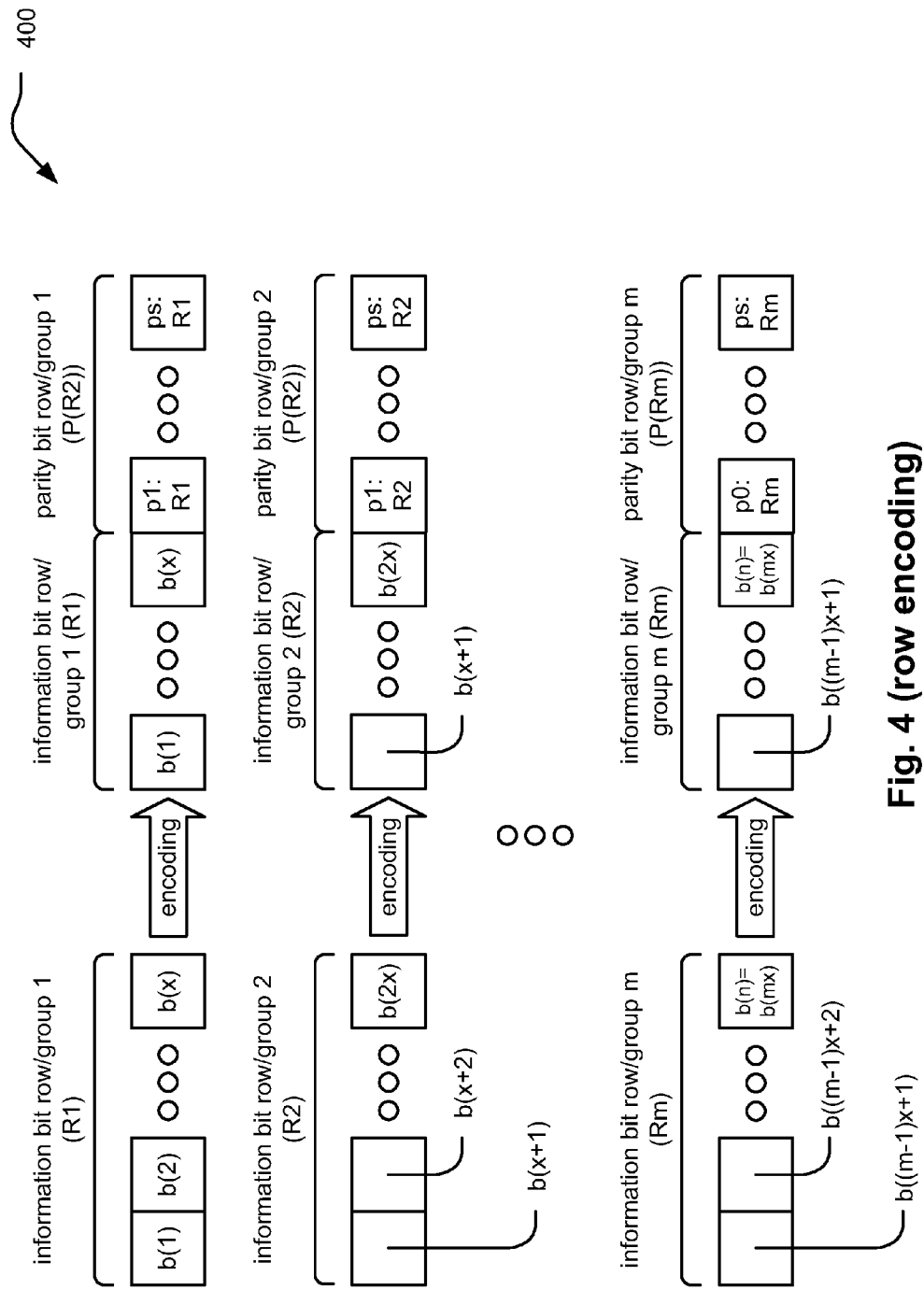
FIG. 4 and FIG. 5 illustrate embodiments of row and column encoding of matrix formatted bits, respectively.
Figure 5:
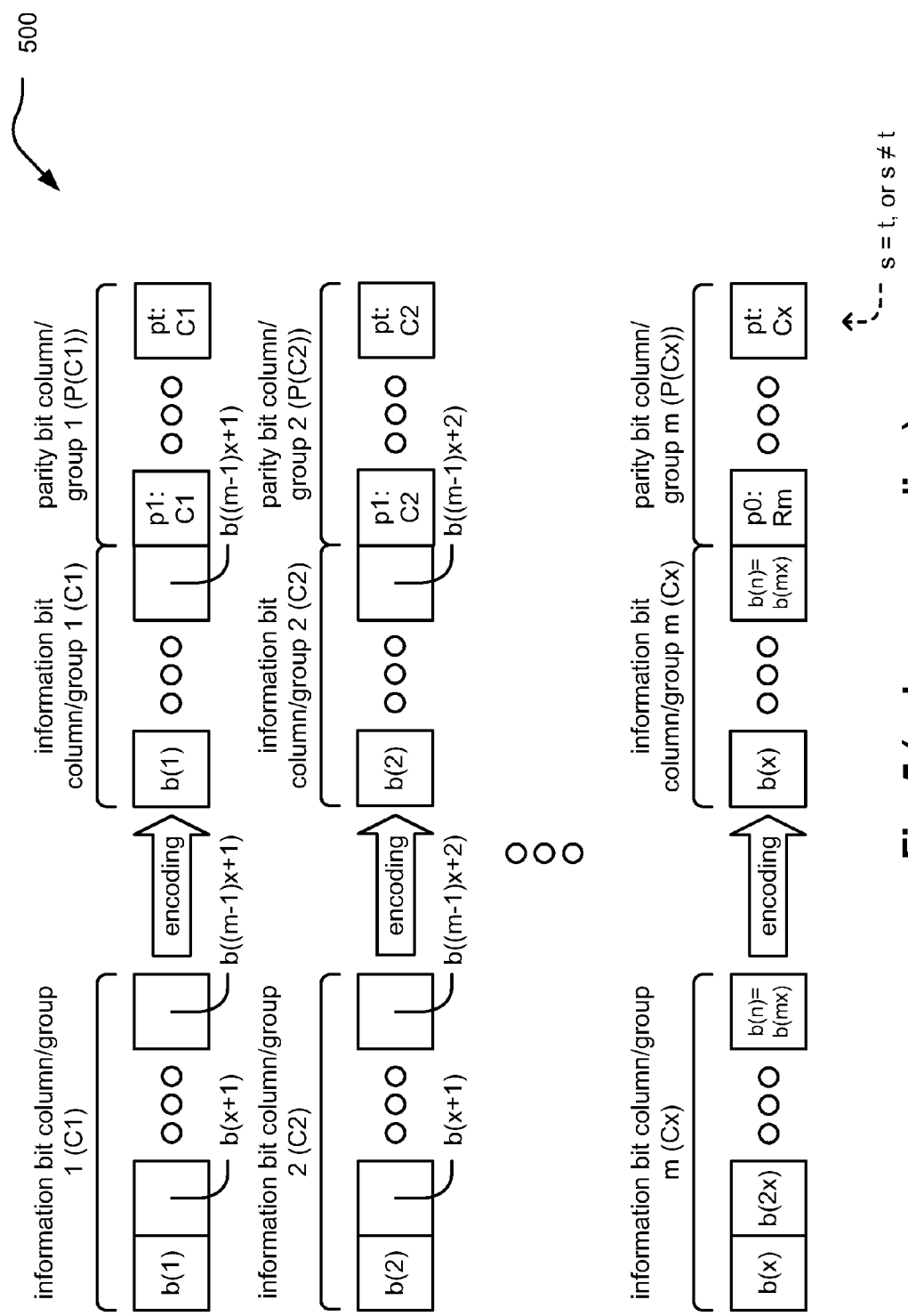

FIG. 4 and FIG. 5 illustrate embodiments, 400 and 500, respectively, of row and column encoding of matrix formatted bits, respectively. These embodiments 400 and 500 depict systematic encoding, but again, non-systematic encoding can be employed in alternative embodiments without departing from the scope and spirit of the invention.

Referring to embodiment 400 of FIG. 4, an information bit row/group 1 (R1) shown as including bits b(1) through b(x) undergo encoding in accordance with an ECC to generate parity bit row/group 1 (P(R1)). For each of the other rows of the matrix formatted bits (e.g., shown in FIG. 3), the corresponding information bit row/group undergoes encoding in accordance with an ECC to generate a corresponding parity bit row/group.

Referring to embodiment 500 of FIG. 5, an information bit column/group 1 (C1) shown as including bits b(1) through b((m−1)x+1) undergo encoding in accordance with an ECC to generate parity bit column/group 1 (P(C1)). For each of the other columns of the matrix formatted bits (e.g., shown in FIG. 3), the corresponding information bit column/group undergoes encoding in accordance with an ECC to generate a corresponding parity bit column/group.

FEC Scheme

One embodiment of a forward error correction (FEC) includes a concatenated coding scheme. This FEC operates in accordance with performing row encoding and column encoding.

The row encoding operates in accordance with:

26×BCH(3884, 3824, 11), t=5, and

6×BCH(3872, 3824, 9), t=4.

For example, the 26×BCH(3884, 3824, 11), t=5 indicates that a BCH code operates on 26 rows of the matrix formatted bits using the BCH(3884, 3824, 11), t=5 code [can correct 5 errors], which has a soft data length/information bit size of 3824 bits and outputs a coded block of 3884 bits (i.e., includes the 3824 information bits+the 60 parity bits generated there from).

The 6×BCH(3872, 3824, 9), t=4, indicates that a BCH code operates on 6 rows of the matrix formatted bits using the BCH(3872, 3824, 9), t=4 code [can correct 4 errors], which has a soft data length/information bit size of 3824 bits and outputs a coded block of 3872 bits (i.e., includes the 3824 information bits+the 48 parity bits generated there from).

Both of these BCH codes are shortened BCH codes over a Galois Field of $GF(2^{12})$. A finite field generator polynomial as follows is employed in this embodiment:

$$x^{12}+x^{11}+x^{8}+x^{6}+1.$$

Generally speaking, this finite field generator polynomial can be any primitive polynomial with degree of 12.

The column encoding operates in accordance with:

64×BCH(2040, 1941, 19), t=9.

The 64×BCH(2040, 1941, 19), t=9, indicates that a BCH code operates on all 64 columns of the matrix formatted bits using the BCH(2040, 1941, 19), t=9 code [can correct 9 errors], which has a soft/hard data length/information bit size of 1941 bits and outputs a coded block of 2040 bits (i.e., includes the 1941 information bits+the 99 parity bits generated there from).

This BCH code is also a shortened BCH code, but over a Galois Field of $GF(2^{11})$. A finite field generator polynomial as follows is employed in this embodiment:

$$x^{11}+x^{2}+1$$

Generally speaking, this finite field generator polynomial can be any primitive polynomial with degree of 11.

The overall coded block size is then 130560 bits, where the source data length is 122368 bits, the total number of parity bits from row encoding is 64×5×12+6×4×12=1848, the total number of parity bits from column decoding is 64×11×9=6336, additional 8 bits can be CRC checksum of entire or partial encoding block or any specific binary sequence of 8 bits. Therefore, the redundancy rate meets the requirement of 16/239 or 6.69% as mentioned above in a particular design constraint. The coding scheme is estimated to have a NCG of 8.87 dB at a target BER of $1\times10^{-15}$.

Another embodiment of a FEC system operates in accordance with performing row encoding and column encoding as follows:

1) An information block is divided into 32 groups, namely, G0, G2, . . . , G31. Each group contains consecutive 3824 bits of source data.

2) Use BCH(3872, 3824, 9), t=4 code to encode each of the (row code) groups. Allocate the parity bits of the first code group immediately after the entire source data sequence, followed by the parity bits of the second group, etc. In other words, all of the corresponding parity bit groups are located after all of the information bit groups.

Finally, allocate the parity bits of the $32^{nd}$ group.

For convenience herein, this (row) encoded sequence is labeled as b[0], b[1], . . . , b[122367], b[122368], . . . , b[123903]. Totally it has 123904 bits.

3) For column encoding, the above encoded sequence is partitioned into 64 groups, namely, H0, H2, . . . , H63. Each group has 1936 bits. For group Hi, i=0, 1, 2, . . . , 63, it contains b[i], b[i+64*1], b[i+64*2], b[i+64*3], . . . , b[i+64*1935]. Use BCH(2046, 1936, 21), t=10 to encode each of the first 29 groups, and use BCH(2035, 1936, 19), t=9 to encode each of the remaining 35 groups. Allocate the new parity bits all after b[123903]. Arrange the first 99 parity bits of each coded group in the same interleaved manner as we take inputs for each column encoder, e.g., allocate the first parity bit of H0 group at b[123904], allocate the first parity bit of H1 group at b[123904+1], . . . , allocate the second parity bit of H0 at b[123904+64], allocate the second parity bit of H1 at b[123904+65], . . . , etc. Allocate the remaining 11 parity bits of the first 29 groups in the same interleaved manner (e.g., allocate the $100^{th}$ parity bit of H0 group at b[130240], allocate the $100^{th}$ parity bit of H1 group at b[130240+1], . . . , allocate the $101^{st}$ parity bit of H0 group at b[130240+29], allocate the $101^{st}$ parity bit of H1 group at b[130240+30], etc. and finally append one extra bit, 0 or 1 at the end). Therefore, the resultant coded block has a total of 130560 bits.

4) Transmit the coded sequence starting from b[0], b[1], until b[130559] (or in accordance with some permuted or interleaved (π-ed) order).

For decoding of a coded signal generated in accordance with this FEC scheme, a maximum iteration of 2 decoding iterations is normally a design constraint set in practice. This code has a net coding gain (NCG) of 8.86 dB at a target BER of $1 \times 10^{-15}$; it is noted that G975.1.I02 has a NCG of 8.99 dB at a target BER of $1 \times 10^{-15}$, and G975.1.I04 has a NCG of 8.67 dB at a target BER of $1 \times 10^{-15}$.

Such a decoder operable to decode such a signal encoded in accordance with FEC scheme may have slightly more logic compared to either G975.1.I3 code or G975.1.I4 code. However, the memory requirement is the same as that of G975.1.I4 code while being much less than that of G975.1.I3.

This FEC scheme has a very good coding gain, and it has a similar burst error correcting capability as the G975.1.I4 code. It also provides a simple interleaving scheme and easy memory addressing, e.g., no symbol alignment is needed as in RS decoding. It also provides a reasonable latency and hardware complexity, while also providing for relatively low power consumption. Specifically, its average employed decoding iterations at target BER is very low.

It is noted that the previously proposed two coding schemes are a basic framework. In practice, many different variations and embodiments can be possible without departing from the scope and spirit of the invention. Thus, many possible variants of the previously described coding schemes may be employed. They include, but are not limited to the following variants:

a) Any possible rearrangements for all the systematic bits and parity bits of 32 row encode blocks.

b) Any possible rearrangement for all the systematic bits of 64 column encode blocks and any possible arrangement of all parity bits of the 64 column encode blocks.

c) All row encoding use BCH(3884, 3824), t=5 codes. 58 column codes use BCH(2040, 1941), t=9, and 6 column codes use BCH(2040, 1952), t=8. There are 2 spare bits, which can be filled with either 0 or 1 for each bit.

d) All column codes use BCH(2040, 1963), t=7. 16 row codes use BCH(3920, 3824), t=8, and the rest 16 row codes use BCH(3932, 3824), t=9. This embodiment includes no spare bits.

e) All column code use BCH(2040, 1952), t=8. 21 row codes use BCH(3908, 3824), t=7. The rest 11 row codes use BCH(3896, 3824), t=6. There are 4 spare bits in this embodiment.

f) Instead of using 64 column codes, we use 128 column codes using BCH(1020, 970), t=5. 21 row codes use BCH (3884, 3824), t=5 codes. 11 row codes use BCH(3872, 3824), t=4 codes. There are 4 spare bits in this embodiment.

g) Any rearrangements for the systematic bits and/or parity bits in the row encoding process and/or in the column decoding process can be performed without departing from the scope and spirit of the invention.

It is also noted that, for any of the previously proposed coding schemes, one or more extended versions may be employed without departing from the scope and spirit of the invention. For example, if the overall code length is doubled, then twice as many row code blocks and twice as many column code (groups/) blocks as before may be used. The number of spare bits will be doubled as well. If the overall code length is tripled (e.g., 122368×3=>130560×3), 3 times as many row code blocks and column blocks may be employed as before. In theory, the overall code length can be increased by N (N>1) times while having N times row codes and N times column codes correspondingly. Generally, any extension of any of the proposed coding schemes may be performed without departing from the scope and spirit of the invention.

Figure 6:
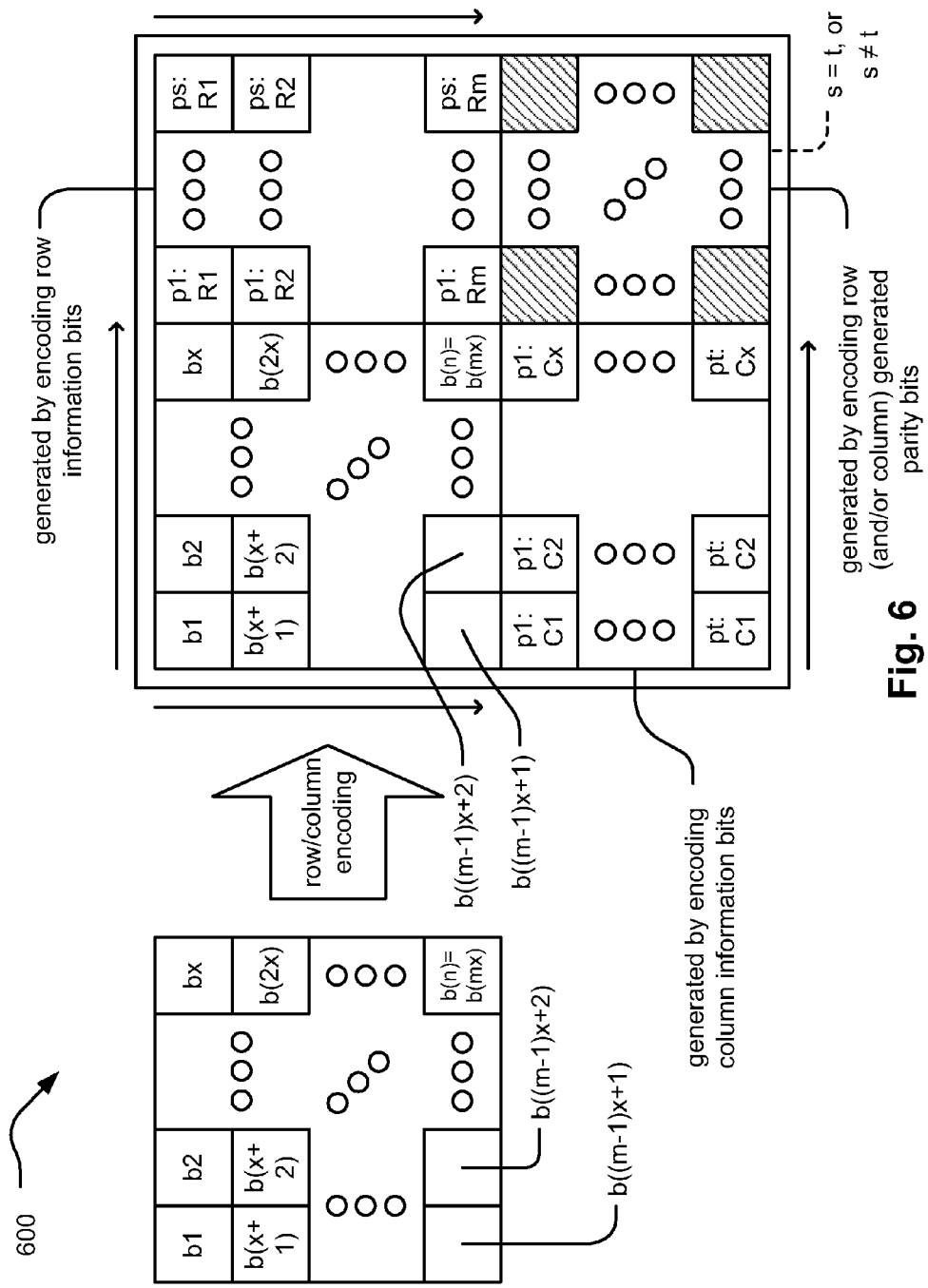
FIG. 6 illustrates an alternative embodiment of row and column encoding of matrix formatted bits.

FIG. 6 illustrates an alternative embodiment 600 of row and column encoding of matrix formatted bits. The embodiment 600 shows the relationship between matrix formatted bits and the parity bits generated in accordance with row encoding and column encoding.

As can be seen when comparing the matrix formatted bits on the left hand side with the resulting encoded matrix on the right hand side, the matrix formatted bits is included in the resulting encoded matrix along with parity bits generated in accordance with row encoding (i.e., located to the right hand side of the matrix formatted bits, shown as including s parity bits each) as well as parity bits generated in accordance with column encoding (i.e., located below the matrix formatted bits, shown as including t parity bits each). It is noted that t may equal s in some embodiments, or t may be different values in other embodiments.

It is also noted that column encoding may subsequently be performed on the parity bits generated in accordance with row encoding to generate additional parity bits included below those parity bits (i.e., located in lower right hand corner of the resulting encoded matrix). Alternatively, it is also noted that row encoding may subsequently be performed on the parity bits generated in accordance with column encoding to generate parity bits included to the right hand side of those parity bits (i.e., located in lower right hand corner of the resulting encoded matrix).

In an even alternative embodiment, a combination of column encoding performed on the parity bits generated in accordance with row encoding and column encoding (i.e., some of the parity bits located in lower right hand corner of the resulting encoded matrix may be generated by encoding the parity bits located above and some of the parity bits located in lower right hand corner of the resulting encoded matrix may be generated by encoding the parity bits located to the left). In even another embodiment, it is also possible to have all of the generated parity bits from row encoding and column encoding appended after the source data sequence.

Figure 7:
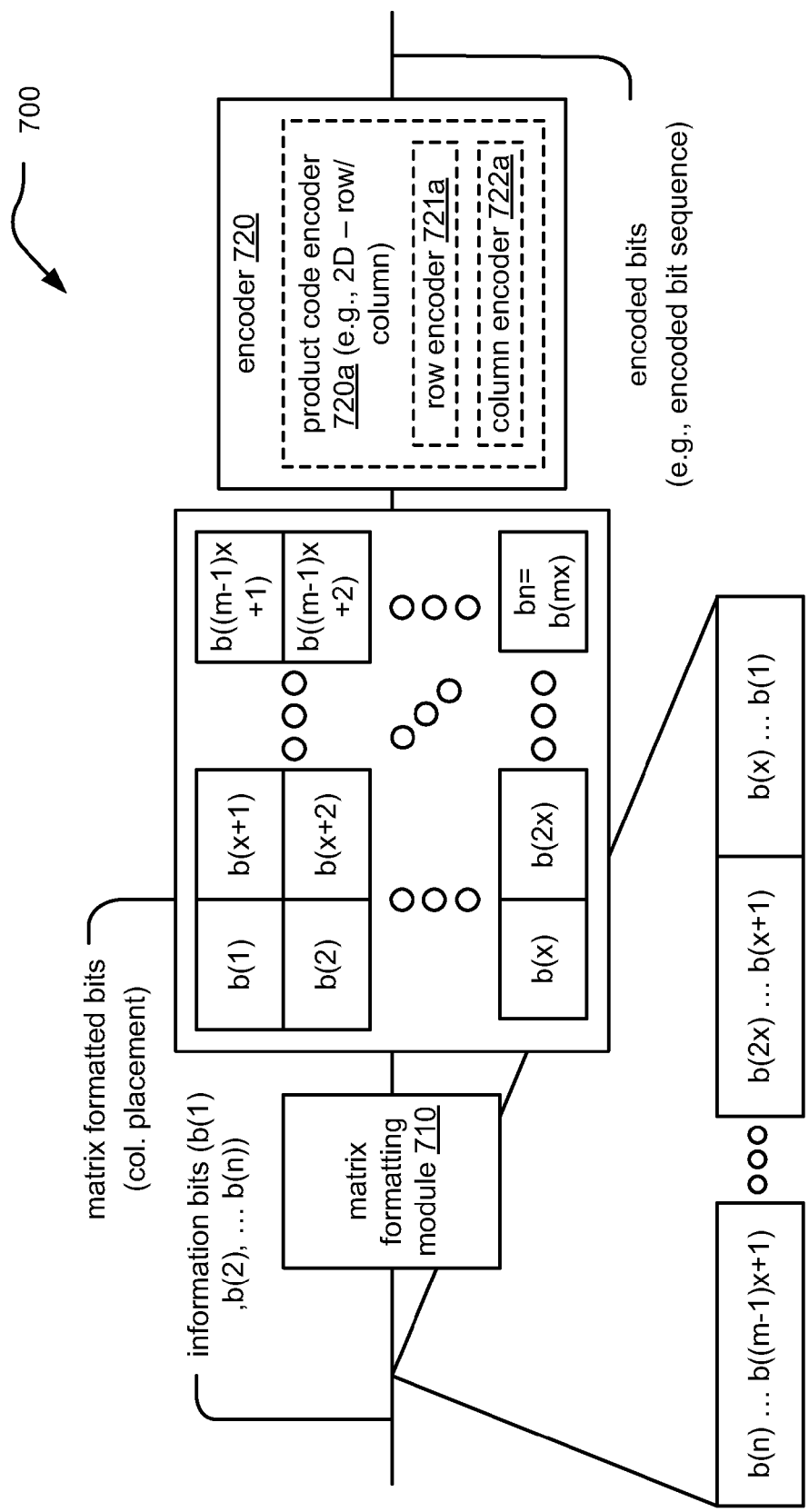
FIG. 7 illustrates an alternative embodiment of an apparatus that is operative to perform matrix formatting and product code encoding.

FIG. 7 illustrates an alternative embodiment of an apparatus 700 that is operative to perform matrix formatting and product code encoding. This embodiment is somewhat analogous to the apparatus 300 of FIG. 3 with at least one difference being that the resulting matrix formatted bits are arranged in accordance with column placement.

In this embodiment, an information bit sequence (e.g., including bits 1 through n as depicted by b(1), b(2), and so on up to b(n)) is provided to a matrix formatting module 710. The matrix formatting module 710 operates by selecting/arranging the information bit sequence into a desired format/pattern. For example, the information bit sequence may be firstly arranged into information bit groups (e.g., first information bit group including bits b(1) through b(x), second information bit group including bits b(x+1) through b(2x), and so on until an $n^{th}$ information bit group including bits b((m−1)x+1) through b(n)[end of original information bit sequence]), and each information bit group then is arranged appropriately into columns (e.g., column placement) thereby generating matrix formatted bits.

An encoder 720 selectively encodes the matrix formatted bits thereby generating encoded bits (e.g., an encoded bit sequence). For example, parity bits corresponding to the matrix formatted bits are generated in accordance with encoding.

In some embodiments, the encoder 720 is a product code encoder 720a. A product code encoder may be viewed as being a two dimensional encoder that operates in a first dimension, and then operates in a second dimension. Each of these two dimensions may employ a common ECC, or they may employ different ECCs. In one embodiment, the first dimension is performed using a row encoder 721a, and the second dimension is performed using a column encoder 722a.

Again, it is noted that a common ECC may be employed when encoding the separate rows of bits within the matrix formatted bits; alternatively, different ECCs may be employed when encoding the various rows of bits within the matrix formatted bits. Similarly, a common ECC may be employed when encoding the separate columns of bits within the matrix formatted bits; alternatively, different ECCs may be employed when encoding the various columns of bits within the matrix formatted bits.

Figure 8:
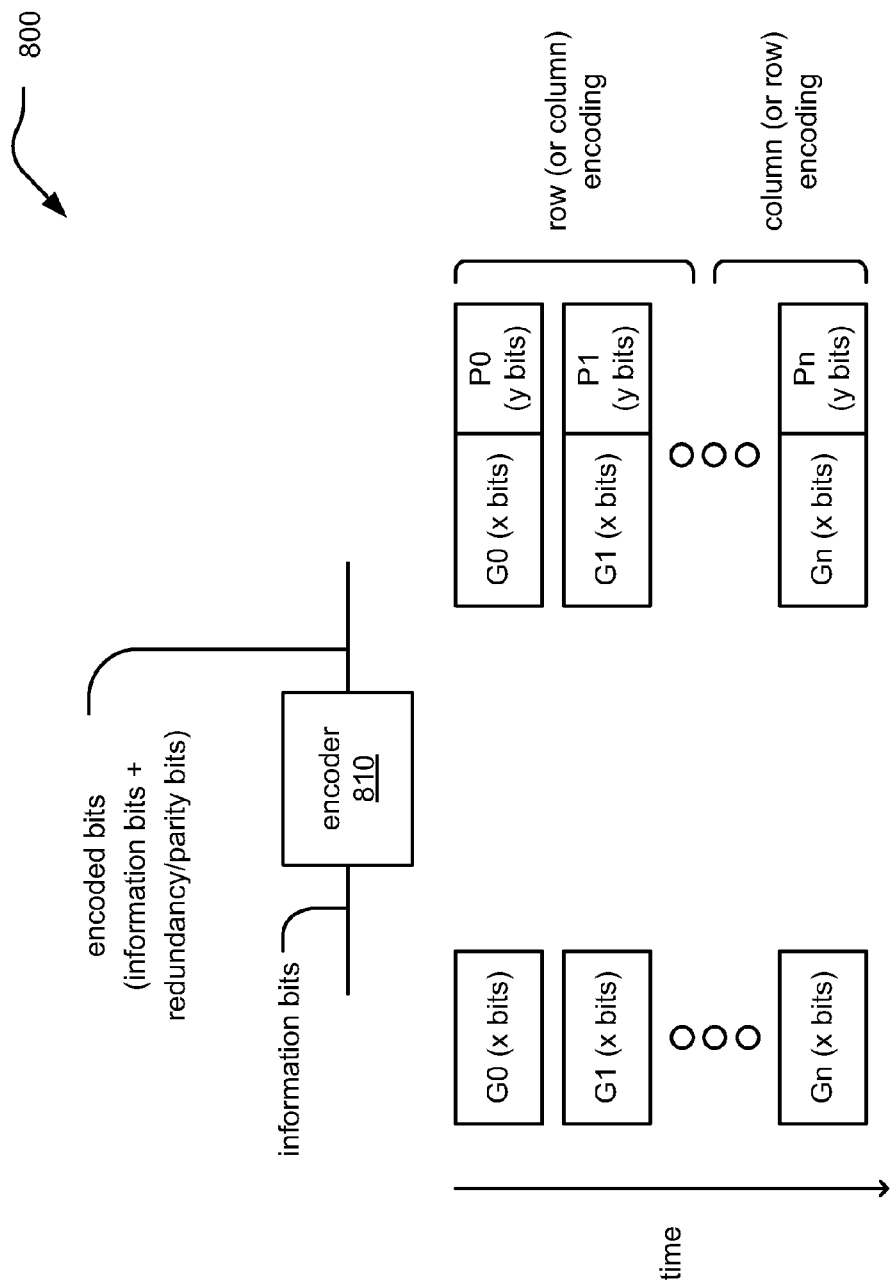
FIG. 8 illustrates an embodiment of systematic bit encoding of various bit groups using a common code for all bit groups.

FIG. 8 illustrates an embodiment 800 of systematic bit encoding of various bit groups using a common code for all bit groups. Information bits are provided to an encoder 810 and encoded bits are output there from (i.e., information bits+redundancy/parity bits in a systematic encoding embodiment).

The information bits are firstly arranged into information bit groups (e.g., first information bit group (G0) including x bits, second information bit group (G1) including x bits, and so on up to information bit group (Gn) including x bits).

Each of the information bit groups undergoes encoding using a common ECC to generate corresponding parity bit groups (each including y bits). Certain of the generated coded bits (e.g., information bits+parity bits) are arranged and undergo row encoding. Other of the generated coded bits (e.g., information bits+parity bits) are arranged and undergo column encoding.

Figure 9:
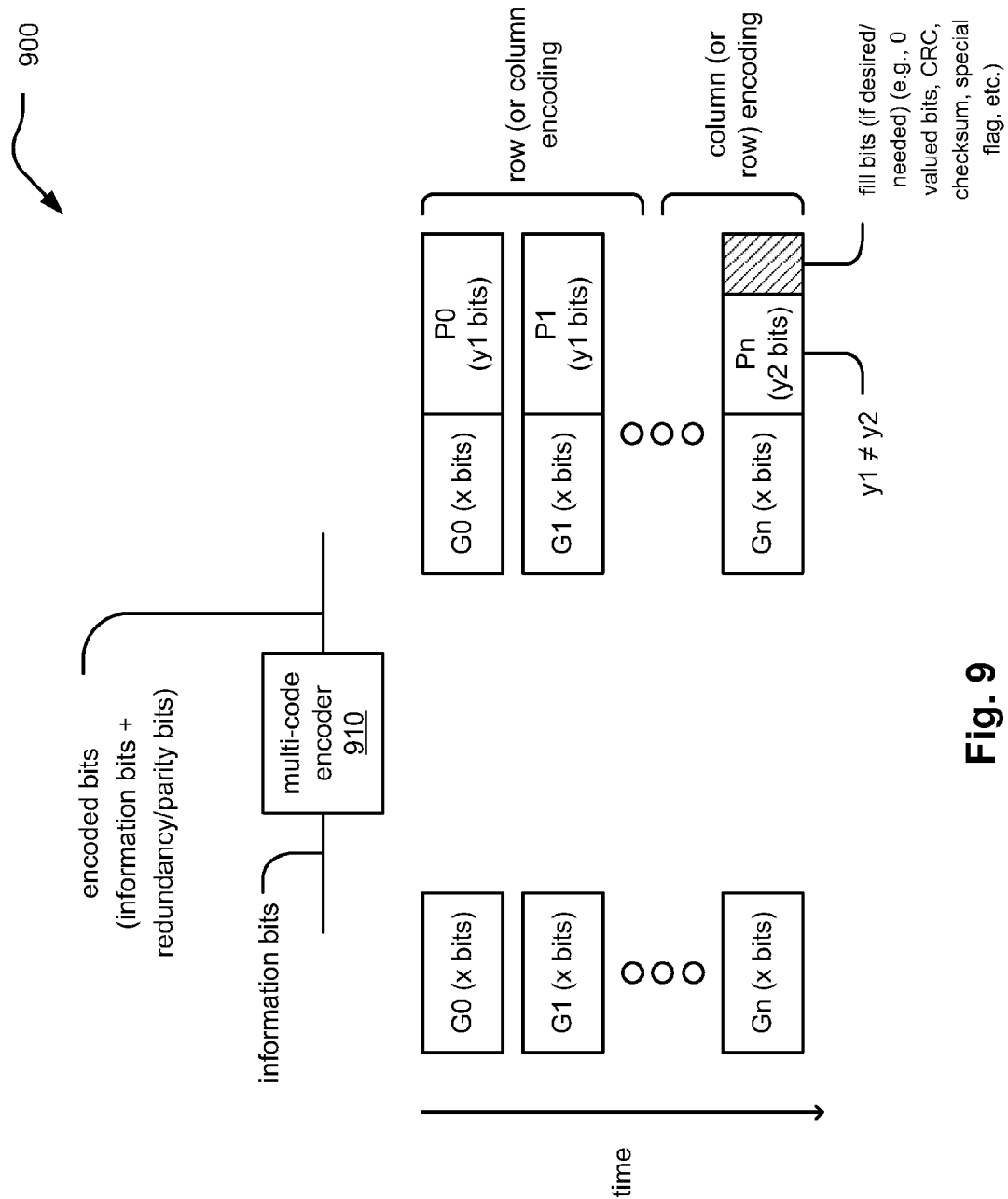
FIG. 9 illustrates an alternative embodiment of systematic bit encoding of various bit groups using two or more codes for the various bit groups.

FIG. 9 illustrates an alternative embodiment 900 of systematic bit encoding of various bit groups using two or more codes for the various bit groups.

Information bits are provided to a multi-code encoder 910 and encoded bits are output there from (i.e., information bits+redundancy/parity bits in a systematic encoding embodiment). The multi-code encoder 910 includes and is operative to employ a different ECC at different times to encode different information bits.

The information bits are firstly arranged into information bit groups (e.g., first information bit group (G0) including x bits, second information bit group (G1) including x bits, and so on up to information bit group (Gn) including x bits).

Each of the information bit groups undergoes encoding using a respective ECC to generate corresponding parity bit groups. For example, the first coded bits includes information bit group (G0) (x bits) and parity bit group P0 (y1 bits). The second coded bits includes information bit group (G1) (x bits) and parity bit group P1 (y1 bits). The first coded bits and the second coded bits are generated using a first ECC (e.g., each of the information bit groups (G0) and (G1) including a same number of bits, and each of the parity bit groups (P0) and (P1) also including a respective same number of bits). However, in this embodiment using a multi-code encoder 910, the coded bits including information bit group (Gn) (x bits) undergo encoding thereby generating parity bit group Pn (yn bits); these information bit group (Gn) (x bits) bits are generated using a second ECC (e.g., that has a different amount of redundancy that the first ECC used to generate the parity bit groups (P0) and (P1)).

If desired, to ensure that a same number of bits are included within each information bit group and each parity bit group (or for any other purpose, e.g., to ensure the overall coded bits meet some constraint or requirement), fill bits may be employed. The placement of these fill bits may be anywhere within that respective sequence (e.g., at the end, at the beginning, interspersed therein in accordance with some pattern). The fill bits may be all zero-valued bits, they may be cyclic redundancy check (CRC) bits, checksum/parity bits, special flag bits to indicate an occurrence of some issue, etc.). In particular, these fill bits may be inserted before encoding or after encoding for one or more of the code groups.

Figure 10:
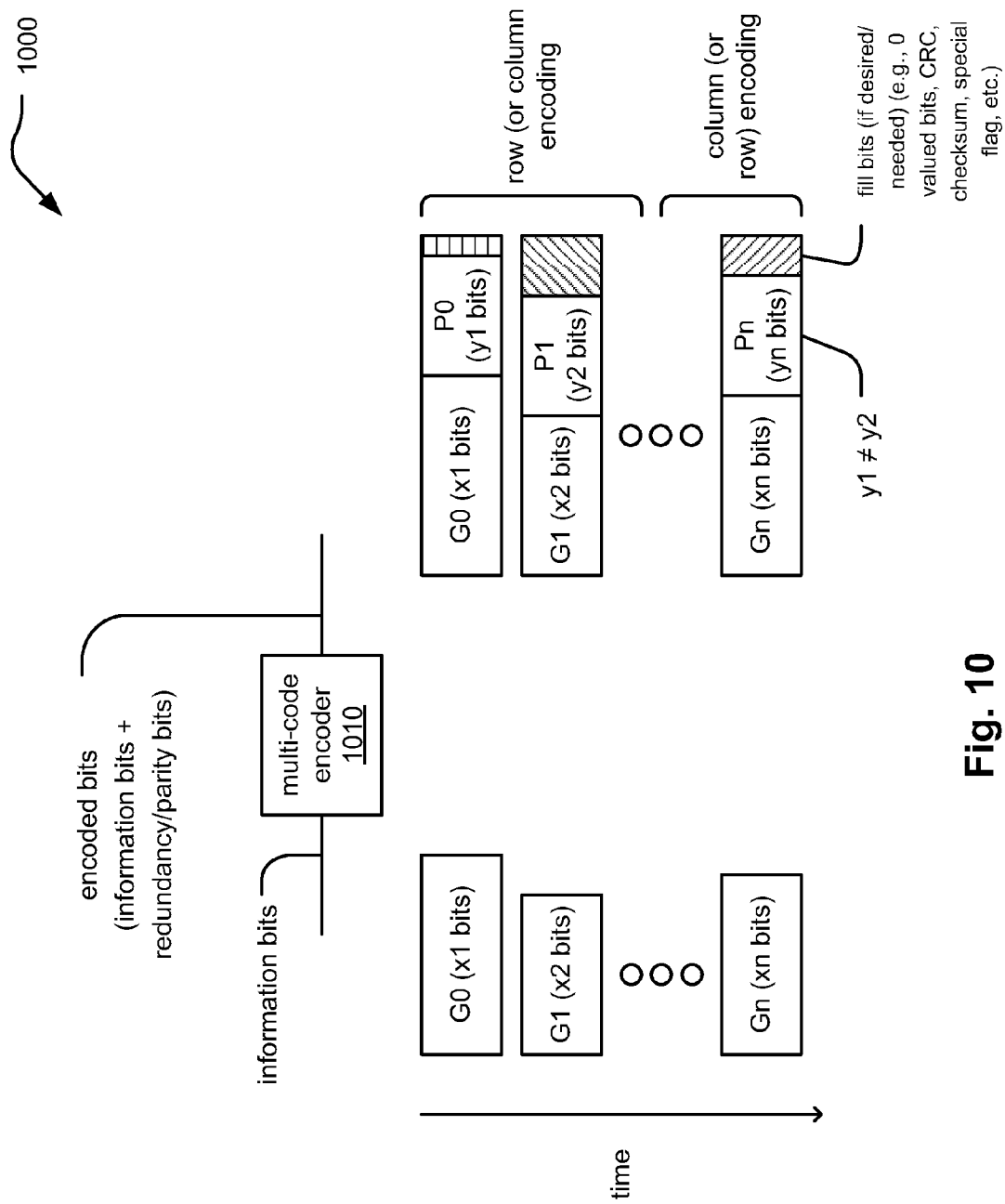
FIG. 10 illustrates an alternative embodiment of systematic bit encoding of various bit groups using two or more codes for the various bit groups.

FIG. 10 illustrates an alternative embodiment 1000 of systematic bit encoding of various bit groups using two or more codes for the various bit groups.

Information bits are provided to a multi-code encoder 1010 and encoded bits are output there from (i.e., information bits+redundancy/parity bits in a systematic encoding embodiment). The multi-code encoder 1010 includes and is operative to employ a different ECC at different times to encode different information bits.

The information bits are firstly arranged into information bit groups (e.g., first information bit group (G0) including x1 bits, second information bit group (G1) including x2 bits, and so on up to information bit group (Gn) including xn bits).

The first coded bits includes information bit group (G0) (x1 bits) and parity bit group P0 (y1 bits) as generated by a first ECC. The second coded bits includes information bit group (G1) (x2 bits) and parity bit group P1 (y2 bits) as generated by a second ECC. The nth coded bits includes information bit group (Gn) (xn bits) and parity bit group Pn (yn bits) as generated by an nth ECC.

If desired, to ensure that a same number of bits is included within each information bit group and each parity bit group (or for any other purpose, e.g., to ensure the overall coded bits meet some constraint or requirement), fill bits may be employed. The placement of these fill bits may be anywhere within that respective sequence (e.g., at the end, at the beginning, interspersed therein in accordance with some pattern). The fill bits may be all zero-valued bits, they may be cyclic redundancy check (CRC) bits, checksum/parity bits, special flag bits to indicate an occurrence of some issue, etc. The fill bits may be different in each of the respective coded bit groups, and certain of the coded bit groups may include no fill bits whatsoever.

Figure 11:
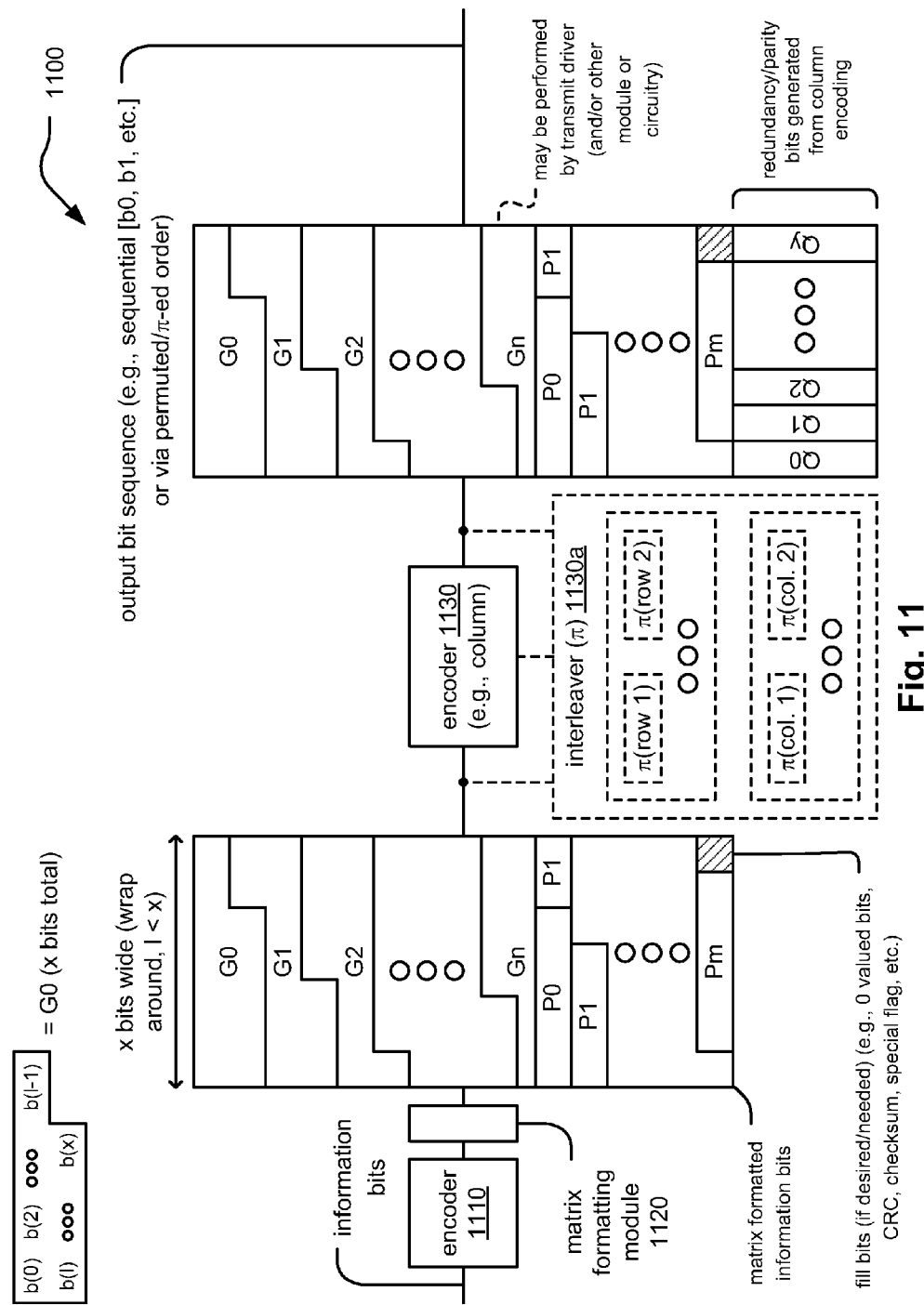
FIG. 11 illustrates an embodiment of an apparatus that is operative to perform systematic bit encoding of various bit groups, matrix formatting, and column encoding of matrix formatted bits.

FIG. 11 illustrates an embodiment of an apparatus 1100 that is operative to perform systematic bit encoding of various bit groups, matrix formatting, and column encoding of matrix formatted bits. Information bits are provided to an encoder 1110 that encodes the information bits in accordance with one or more ECCs. If desired, the information bits may firstly be arranged into information bit groups. In one embodiment, each of bit groups includes a same number of bits (e.g., first information bit group (G0) including x bits, second information bit group (G1) including x bits, and so on up to information bit group (Gn) including x bits). In another embodiment, the bit groups may include different numbers of bits (e.g., first information bit group (G0) including x1 bits, second information bit group (G1) including x2 bits, and so on up to information bit group (Gn) including xn bits).

A matrix formatting module 1120 then arranged the encoded bits output from the encoder 1110 in accordance with some desired pattern. In this embodiment, the encoded bits (include various groups of information bits (G0, G1, and so on up to Gn) and various groups of parity bits (P0, P1, and so on up to Pn) are arranged such that the various groups of information bits precede the various groups of parity bits. The number of bits within each information bit group includes more bits than the matrix is wide (e.g., each information bit group includes x bits and the matrix is only 1 bits wide, where 1<x). Therefore, the bits within each information bit group are wrapped around and occupy multiple rows within the matrix.

If desired, to ensure that a number of bits within the matrix correspond to a total size of the matrix, fill bits may be employed. The fill bits shown in this embodiment are located in the lower right hand corner of the matrix. However, the placement of these fill bits may be anywhere within the matrix. The fill bits may be all zero-valued bits, they may be cyclic redundancy check (CRC) bits, any kind of parity bits, checksum bits, special flag bits to indicate an occurrence of some issue, etc.).

The matrix formatted bits are provided to an encoder 1130, that employs one or more ECCs, to generate coded bits. The encoding of this embodiment is performed in accordance with column encoding, within the encoder 1130, of the matrix generated by matrix formatting module 1120. These coded bit groups are shown as being Q0, Q1, and so on up to Qy. It is noted that certain fill bits may be included within one or more of the coded bit groups Q0, Q1, and so on up to Qy. It is also noted that, in certain embodiment, different codes can be respectively employed for encoding of different respective columns of matrix formatter bits. Also, if desired, some embodiments may also include one or more fill bits within respective rows and/or columns before or after performing row and/or column encoding (of course, other embodiments may include no fill bits).

In some embodiments, an interleaver 1130a may be implemented to perform interleaving (in accordance with row interleaving, column interleaving, which may also be implemented on a row by row basis or a column by column basis) of the bits within the matrix generated by the matrix formatting module 1120 before they are provided to the encoder 1130. In another embodiment, the interleaver 1130a may be implemented to perform interleaving (in accordance with row interleaving, column interleaving, which may also be implemented on a row by row basis or a column by column basis) of the coded bits output from the encoder 1130.

Figure 12:
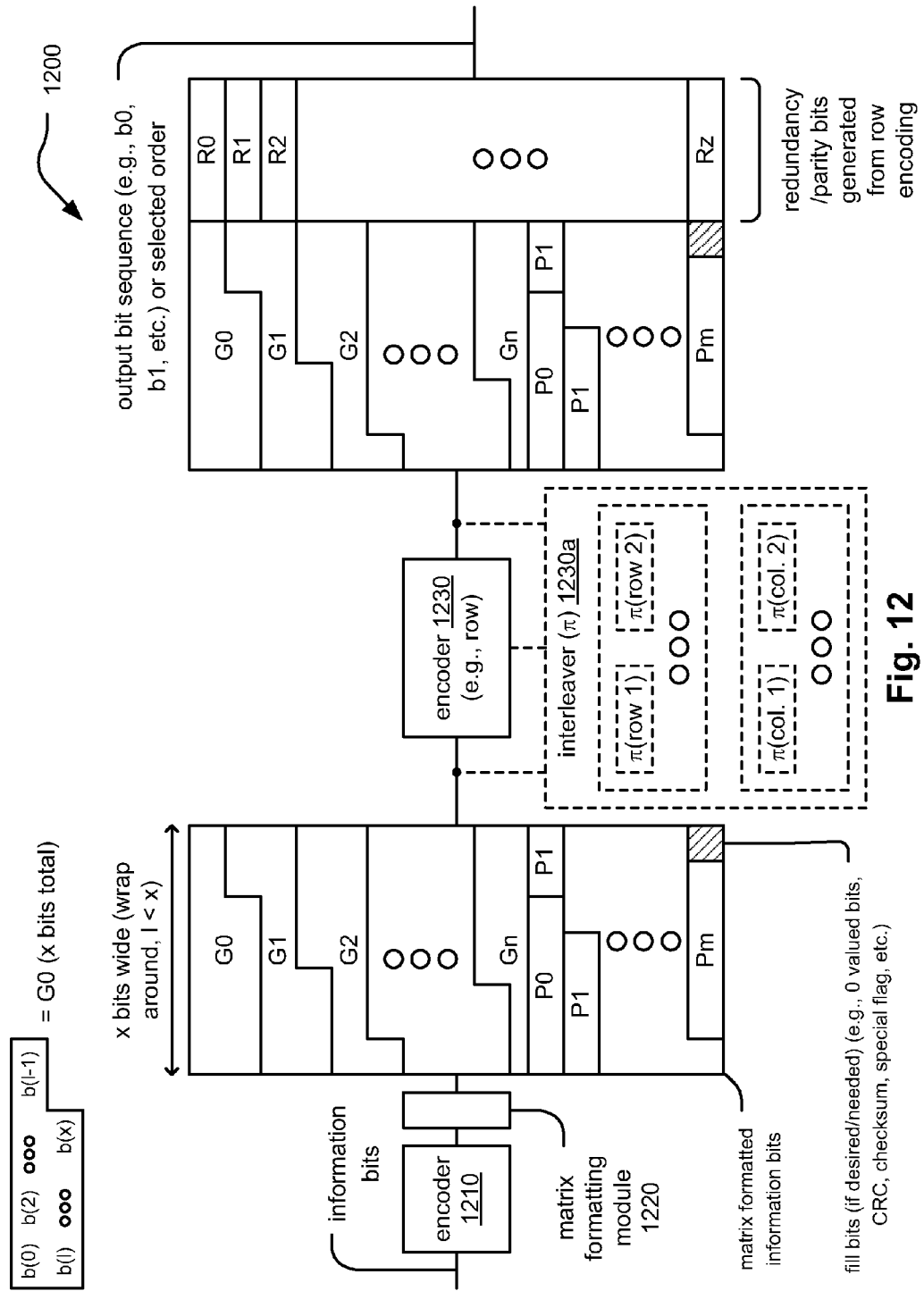
FIG. 12 illustrates an embodiment of an apparatus that is operative to perform systematic bit encoding of various bit groups, matrix formatting, and row encoding of matrix formatted bits.

FIG. 12 illustrates an embodiment of an apparatus 1200 that is operative to perform systematic bit encoding of various bit groups, matrix formatting, and row encoding of matrix formatted bits. This apparatus 1200 also includes an encoder 1210, a matrix formatting module 1220, and an encoder 1230 (and optionally an interleaver 1230a).

In this embodiment, in comparison to the previous embodiment, the encoding of this embodiment is performed in accordance with row encoding, within the encoder 1230, of the matrix generated by matrix formatting module 1220. These coded bit groups are shown as being R0, R1, and so on up to Rz. It is noted that certain fill bits may be included within one or more of the coded bit groups R0, R1, and so on up to Rz.

Figure 13:
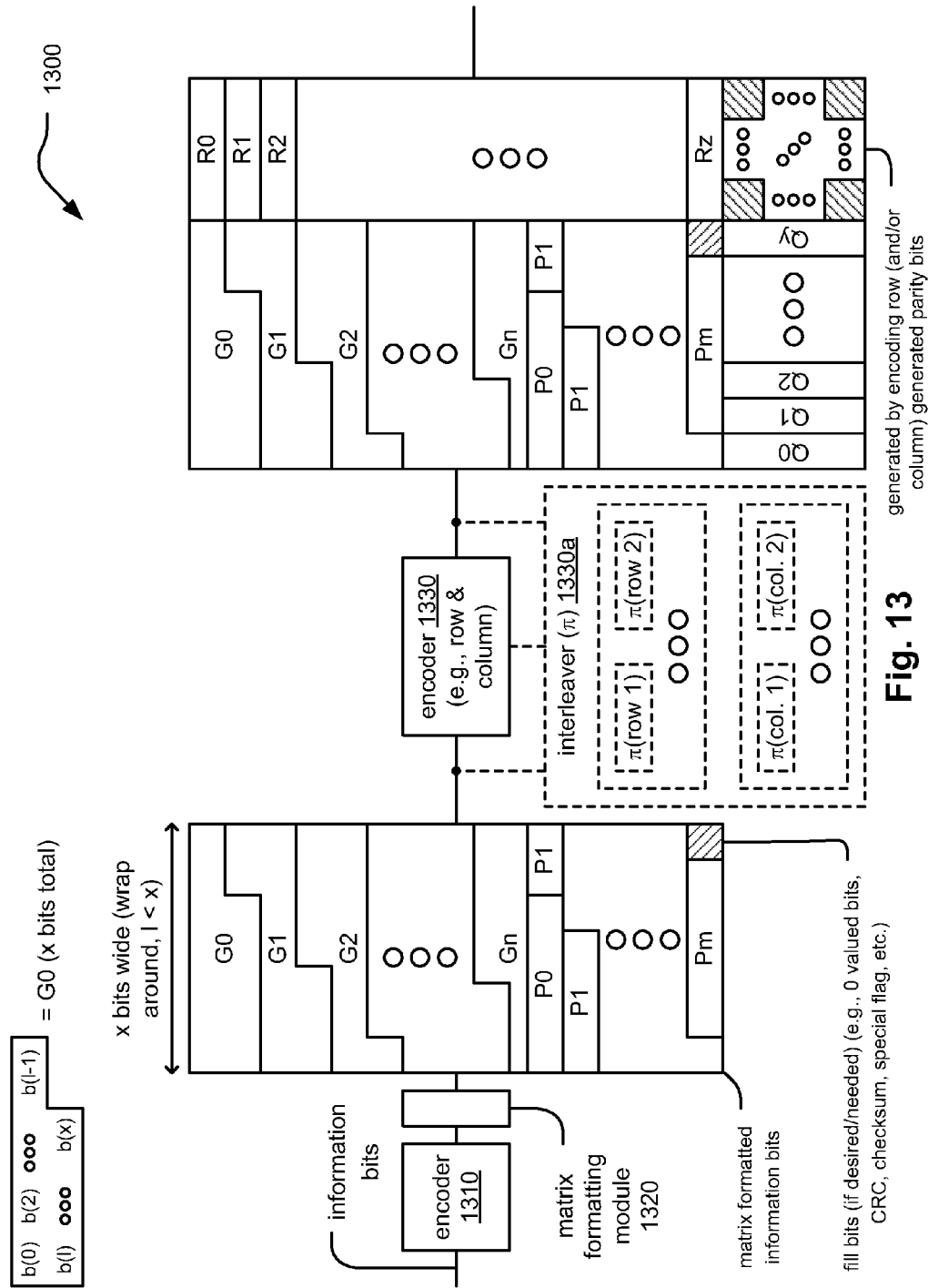
FIG. 13 illustrates an embodiment of an apparatus that is operative to perform systematic bit encoding of various bit groups, matrix formatting, and row and column encoding of matrix formatted bits.

FIG. 13 illustrates an embodiment of an apparatus 1300 that is operative to perform systematic bit encoding of various bit groups, matrix formatting, and row and column encoding of matrix formatted bits. This apparatus 1300 also includes an encoder 1310, a matrix formatting module 1320, and an encoder 1330 (and optionally an interleaver 1330a).

In this embodiment, in comparison to the previous two embodiments, the encoding of this embodiment is performed in accordance with both row and column encoding, within the encoder 1330, of the matrix generated by matrix formatting module 1320.

These row encoding generated coded bit groups are shown as being R0, R1, and so on up to Rz. These column encoding generated coded bit groups are shown as being Q0, Q1, and so on up to Qy. It is noted that certain fill bits may be included within one or more of the coded bit groups R0, R1, and so on up to Rz. It is also noted that certain fill bits may be included within one or more of the coded bit groups Q0, Q1, and so on up to Qy.

Moreover, column and/or row encoding of the row encoding generated coded bit groups (e.g., R0, R1, and so on up to Rz) and/or the column encoding generated coded bit groups (e.g., Q0, Q1, and so on up to Qy); these bits are shown in the lower right hand corner of the coded bit matrix on the right hand side of the diagram. It is also noted that certain fill bits may be included within these bits as well.

In addition, with respect to the various diagrams shown herein, it is noted that while the various bits groups such as the first information bit group (G0) including x bits, second information bit group (G1) including x bits, and so on up to information bit group (Gn) including x bits may have the same number of bits (e.g., x bits in this instance), the size of the various, respective redundancy bits may be respectively different in size (e.g., as mentioned above, first information bit group (G0) including x1 bits, second information bit group (G1) including x2 bits, and so on up to information bit group (Gn) including xn bits—each respectively including a different number of bits)

Also, while pictorially each of the coded bit groups R0, R1, and so on up to Rz may be viewed as being of the same size in this embodiment, it is noted that this need not be so in all embodiments (e.g., each of the respective coded bit groups R0, R1, and so on up to Rz may respectively include different numbers of bits). Likewise, while pictorially each of the coded bit groups Q0, Q1, and so on up to Qy may be viewed as being of the same size in this embodiment, it is noted that this need not be so in all embodiments (e.g., each of the respective coded bit groups Q0, Q1, and so on up to Qy may respectively include different numbers of bits).

Moreover, it is noted that in these previous embodiments, as well as other embodiments described herein, various embodiments may include more or fewer modules and/or functional blocks without departing from the scope and spirit of the invention.

FIG. 14A, FIG. 14B, FIG. 15A, and FIG. 15B illustrate various embodiments of a method for performing matrix formatting and product code encoding.

Referring to method 1400 of FIG. 14A, the method 1400 begins by partitioning information bits into plurality of information bit groups, as shown in a block 1410.

The method 1400 continues by encoding a first bit group (of the plurality of information bit groups) thereby generating a first plurality of redundancy/parity bits, as shown in a block 1420.

The method 1400 then operates by encoding a second bit group (of the plurality of information bit groups) thereby generating a second plurality of redundancy/parity bits, as shown in a block 1430. This encoding processing of the various bit groups continues until all of the bit groups have undergone encoding.

The method 1400 continues by matrix formatting the information bit groups and redundancy/parity bit groups thereby generating matrix formatted bits, as shown in a block 1440. The method 1400 continues by performing row and/or column encoding of matrix formatted bits thereby generating coded matrix, as shown in a block 1450. The method 1400 continues by outputting bit sequence from coded matrix (e.g., sequential or via permuted/π-ed order), as shown in a block 1460.

Referring to method 1401 of FIG. 14B, the method 1401 begins by partitioning information bits into plurality of information bit groups, as shown in a block 1411. The method 1401 then operates by encoding bit groups 1 . . . A using first code thereby generating redundancy/parity bit groups 1 . . . A, as shown in a block 1421.

The method 1401 continues by encoding bit groups A+1 . . . B using second code thereby generating redundancy/parity bit groups A+1 . . . B, as shown in a block 1431. This encoding processing of the various bit groups continues until all of the bit groups have undergone encoding.

The method 1401 then operates by matrix formatting the information bit groups and redundancy/parity bit groups thereby generating matrix formatted bits, as shown in a block 1441. In some embodiments, the method 1401 operates by including 1 or more fill bits (e.g., 0 valued bits, CRC, checksum, special flag, etc.), as shown in a block 1441a.

The method 1401 then operates by performing row and/or column encoding of matrix formatted bits thereby generating coded matrix, as shown in a block 1451. The method 1401 then operates by outputting bit sequence from coded matrix (e.g., sequential or via permuted/π-ed order), as shown in a block 1461.

Referring to method 1500 of FIG. 15A, the method 1500 begins by receiving information bit groups and corresponding redundancy/parity bit groups, as shown in a block 1510. This is based on the supposition that encoding of the information bit groups has already been performed, thereby generating the corresponding redundancy/parity bit groups. Of course, the method 1500 could alternatively operate firstly by receiving information bit groups and encoding the information bit groups thereby generating the corresponding redundancy/parity bit groups.

The method 1500 continues by arranging corresponding redundancy/parity bit groups after all information bit groups, as shown in a block 1520. The method 1500 then operates by matrix formatting the information bit groups and redundancy/parity bit groups thereby generating matrix formatted bits, as shown in a block 1530.

The method 1500 continues by performing row and/or column encoding of matrix formatted bits thereby generating coded matrix, as shown in a block 1540. The method 1500 continues by outputting bit sequence from coded matrix (e.g., sequential or via permuted/π-ed order), as shown in a block 1550.

Referring to method 1501 of FIG. 15B, the method 1501 begins by receiving information bit groups and corresponding redundancy/parity bit groups, as shown in a block 1511.

The method 1501 then operates by matrix formatting the information bit groups and redundancy/parity bit groups thereby generating matrix formatted bits, as shown in a block 1521. In some embodiments, the method 1501 operates by arranging each respective information bit group across 1 or more rows (or columns), as shown in a block 1521a. In even other embodiments, the method 1501 operates by arranging each respective redundancy/parity bit group across 1 or more rows (or columns), as shown in a block 1521b.

The method 1501 continues by performing row and/or column encoding of matrix formatted bits thereby generating coded matrix, as shown in a block 1531. The method 1501 then operates by outputting bit sequence from coded matrix (e.g., sequential or via permuted/π-ed order), as shown in a block 1541.

While many of the embodiments described herein have been directed to encoding processing, it is of course noted that corresponding decoding processing (including various embodiments of apparatus and various embodiments of methods corresponding thereto) may also be performed in accordance with the principles presented herein. For example, any embodiment of an apparatus that is operative to process and any embodiment of a method for processing a signal having the characteristics described herein may also be implemented without departing from the scope and spirit of the invention.

It is noted that the various circuitries and/or modules (e.g., for encoding, for decoding, for processing, for matrix formatting, for interleaving, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

It is also noted that any of the connections or couplings between the various modules, circuits, functional blocks, components, devices, etc. within any of the various diagrams or as described herein may be of any type as desired such as a direct connection, an indirection connection (e.g., with one or more intervening components there between), a communicative coupling, etc. without departing from the scope and spirit of the invention.

Various aspects of the present invention have also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Various aspects of the present invention have been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, various aspects of the present invention are not limited to such embodiments. It will be obvious to one of average skill in the art that various changes and modifications may be practiced within the spirit and scope of the invention, as limited only by the scope of the appended claims.

What is claimed is:

1. An apparatus, comprising:
   a matrix formatting module to:
   partition a plurality of bits into a plurality of bit groups, such each of the plurality of bit groups respectively includes a consecutive subset of the plurality of bits; and
   arrange the plurality of bit groups and at least one fill bit in accordance with a predetermined pattern to generate a plurality of matrix formatted bits that includes a predetermined plurality of bits such that at least one of the plurality of bit groups spans more than one matrix row of the plurality of matrix formatted bits;
   an encoder module, communicatively coupled to the matrix formatting module, to perform at least one of:
   encode bits within a plurality of rows of the plurality of matrix formatted bits to generate a first plurality of parity bits; and
   encode bits within a plurality of columns of the plurality of matrix formatted bits to generate a second plurality of parity bits; and
   a transmit driver, communicatively coupled to the encoder module, to arrange the plurality of matrix formatted bits and at least one of the first plurality of parity bits and the second plurality of parity bits to generate an output bit sequence.

2. The apparatus of claim 1, wherein:
   the encoder module to employ a Reed-Solomon (RS) code, a turbo code, a turbo trellis code modulation (TTCM) code, a LDPC (Low Density Parity Check) code, or a BCH (Bose and Ray-Chaudhuri, and Hocquenghem) code.

3. The apparatus of claim 1, further comprising:
   an interleaver module, communicatively coupled to the encoder module, to interleave at least one of:
   the plurality of matrix formatted bits;
   bits within a row of the plurality of matrix formatted bits;
   bits within a column of the plurality of matrix formatted bits;
   the first plurality of parity bits; and
   the second plurality of parity bits.

4. The apparatus of claim 1, wherein:
   bits within at least one of the plurality of bit groups are emplaced within a plurality of rows of the plurality of matrix formatted bits.

5. The apparatus of claim 1, wherein:
   the encoder module being a multi-code encoder module to employ a first error correction code (ECC) to encode a first subset of the plurality of matrix formatted bits and employ a second ECC to encode a second subset of the plurality of matrix formatted bits.

6. The apparatus of claim 1, further comprising:
   at least one additional encoder module, communicatively coupled to the matrix formatting module, to encode a plurality of information bits to generate the plurality of bits.

7. The apparatus of claim 6, wherein:
   the at least one additional encoder module employs a Reed-Solomon (RS) code, a turbo code, a turbo trellis code modulation (TTCM) code, a LDPC (Low Density Parity Check) code, or a BCH (Bose and Ray-Chaudhuri, and Hocquenghem) code.

8. The apparatus of claim 1, wherein:
   the encoder module to encode at least one of the first plurality of parity bits and the second plurality of parity bits to generate a third plurality of parity bits; and
   the transmit driver also to arrange the third plurality of parity bits in accordance with generating the output bit sequence.

9. The apparatus of claim 1, wherein:
   the matrix formatting module to arrange the plurality of bit groups and at least one fill bit in accordance with the predetermined pattern to generate the plurality of matrix formatted bits.

10. The apparatus of claim 1, wherein:
    the apparatus being a operative within at least one of a satellite communication system, a wireless communication system, a wired communication system, and a fiber-optic communication system.

11. An apparatus, comprising:
    a first encoder module to encode a plurality of information bits to generate a plurality of bits;
    a matrix formatting module, communicatively coupled to the first encoder module, to:
    partition the plurality of bits into a plurality of bit groups, such each of the plurality of bit groups respectively includes a consecutive subset of the plurality of bits; and
    arrange the plurality of bit groups and at least one fill bit in accordance with a predetermined pattern to generate a plurality of matrix formatted bits that includes a predetermined plurality of bits such that at least one of the plurality of bit groups spans more than one matrix row of the plurality of matrix formatted bits;
    a second encoder module, communicatively coupled to the matrix formatting module, to:
    encode bits within a plurality of rows of the plurality of matrix formatted bits to generate a first plurality of parity bits;
    encode bits within a plurality of columns of the plurality of matrix formatted bits to generate a second plurality of parity bits; and
    encode at least one of the first plurality of parity bits and the second plurality of parity bits to generate a third plurality of parity bits; and
    a transmit driver, communicatively coupled to the second encoder module, to arrange the plurality of matrix formatted bits and at least one of the first plurality of parity bits and the second plurality of parity bits to generate an output bit sequence.

12. The apparatus of claim 11, wherein:
at least one of the first encoder module and the second encoder module employs a Reed-Solomon (RS) code, a turbo code, a turbo trellis code modulation (TTCM) code, a LDPC (Low Density Parity Check) code, or a BCH (Bose and Ray-Chaudhuri, and Hocquenghem) code.

13. The apparatus of claim 11, further comprising:
an interleaver module, communicatively coupled to the second encoder module, to interleave at least one of:
the plurality of matrix formatted bits;
bits within a row of the plurality of matrix formatted bits;
bits within a column of the plurality of matrix formatted bits;
the first plurality of parity bits; and
the second plurality of parity bits.

14. The apparatus of claim 11, wherein:
the second encoder module being a multi-code encoder module to employ a first error correction code (ECC) to encode a first subset of the plurality of matrix formatted bits and employ a second ECC to encode a second subset of the plurality of matrix formatted bits.

15. The apparatus of claim 11, wherein:
the apparatus being a operative within at least one of a satellite communication system, a wireless communication system, a wired communication system, and a fiber-optic communication system.

16. A method, comprising:
employing a matrix formatting module for:
  partitioning a plurality of bits into a plurality of bit groups, such each of the plurality of bit groups respectively includes a consecutive subset of the plurality of bits; and
  arranging the plurality of bit groups and at least one fill bit in accordance with a predetermined pattern to generate a plurality of matrix formatted bits that includes a predetermined plurality of bits such that at least one of the plurality of bit groups spans more than one matrix row of the plurality of matrix formatted bits;
employing an encoder module, communicatively coupled to the matrix formatting module, for at least one of:
  encoding of bits within a plurality of rows of the plurality of matrix formatted bits thereby generating a first plurality of parity bits; and
  encoding of bits within a plurality of columns of the plurality of matrix formatted bits thereby generating a second plurality of parity bits; and
arranging the plurality of matrix formatted bits and at least one of the first plurality of parity bits and the second plurality of parity bits thereby generating an output bit sequence.

17. The method of claim 16, wherein:
the encoder module employs a Reed-Solomon (RS) code, a turbo code, a turbo trellis code modulation (TTCM) code, a LDPC (Low Density Parity Check) code, or a BCH (Bose and Ray-Chaudhuri, and Hocquenghem) code.

18. The method of claim 16, further comprising interleaving at least one of:
the plurality of matrix formatted bits;
bits within a row of the plurality of matrix formatted bits;
bits within a column of the plurality of matrix formatted bits;
the first plurality of parity bits; and
the second plurality of parity bits.

19. The method of claim 16, further comprising:
employing the encoder module for encoding at least one of the first plurality of parity bits and the second plurality of parity bits thereby generating a third plurality of parity bits; and
arranging the third plurality of parity bits in accordance with generating the output bit sequence.

20. The method of claim 16, wherein:
the method being performed within a communication device; and
the communication device being operative within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO.       : 8,341,509 B2  
APPLICATION NO.  : 12/725887  
DATED            : December 25, 2012  
INVENTOR(S)      : Wang et al.

Page 1 of 1

It is certified that error appears in the above-identified patent and that said Letters Patent is hereby corrected as shown below:

In the Claims

Col. 15, line 27, in claim 1: after "such" insert --that--  
Col. 16, line 43, in claim 11: after "such" insert --that--  
Col. 17, line 32, in claim 16: after "such" insert --that--

Signed and Sealed this  
Twenty-second Day of October, 2013

Teresa Stanek Rea  
*Deputy Director of the United States Patent and Trademark Office*